United States Patent [19]
Janer

[11] Patent Number: 5,131,009
[45] Date of Patent: Jul. 14, 1992

[54] DIGITAL RADIO LINK RECEIVING DEVICE

[75] Inventor: Patrick Janer, Levallois-Perret, France

[73] Assignee: Alcatel Transmission Par Faisceaux Hertziens, Cedex, France

[21] Appl. No.: 551,373

[22] Filed: Jul. 11, 1990

[30] Foreign Application Priority Data

Jul. 12, 1989 [FR] France ............................ 89 09399

[51] Int. Cl.$^5$ .............................................. H04L 27/06
[52] U.S. Cl. .......................................... 375/97; 375/98; 455/245.1; 329/323; 329/325
[58] Field of Search ................... 375/77, 80, 82, 97, 375/98; 455/245, 324; 329/323, 325

[56] References Cited

U.S. PATENT DOCUMENTS

| | | | |
|---|---|---|---|
| 3,546,383 | 12/1970 | Lyon | 370/55 |
| 4,633,484 | 12/1986 | Takeda et al. | 375/98 |
| 4,677,690 | 6/1987 | Reed | 455/324 |
| 4,901,332 | 2/1990 | Williams et al. | 375/98 |

OTHER PUBLICATIONS

IEEE Global Telecommunications Conference and Exhibition, Conference Record, vol. 3 of 3, 1988, pp. 1741-1746; W. A. Conner; "Direct RF modulation 256QAM microwave system".

Primary Examiner—Benedict V. Safourek
Assistant Examiner—Young Tse
Attorney, Agent, or Firm—Sughrue, Mion, Zinn, Macpeak & Seas

[57] ABSTRACT

The invention provides a digital radio link receiving device consisting of a microwave frequency part with a device for signal downconversion to an intermediate frequency, an intermediate frequency part limited to direct demodulation of the signal at intermediate frequency, and a baseband part responsible for processing the signal.

6 Claims, 1 Drawing Sheet

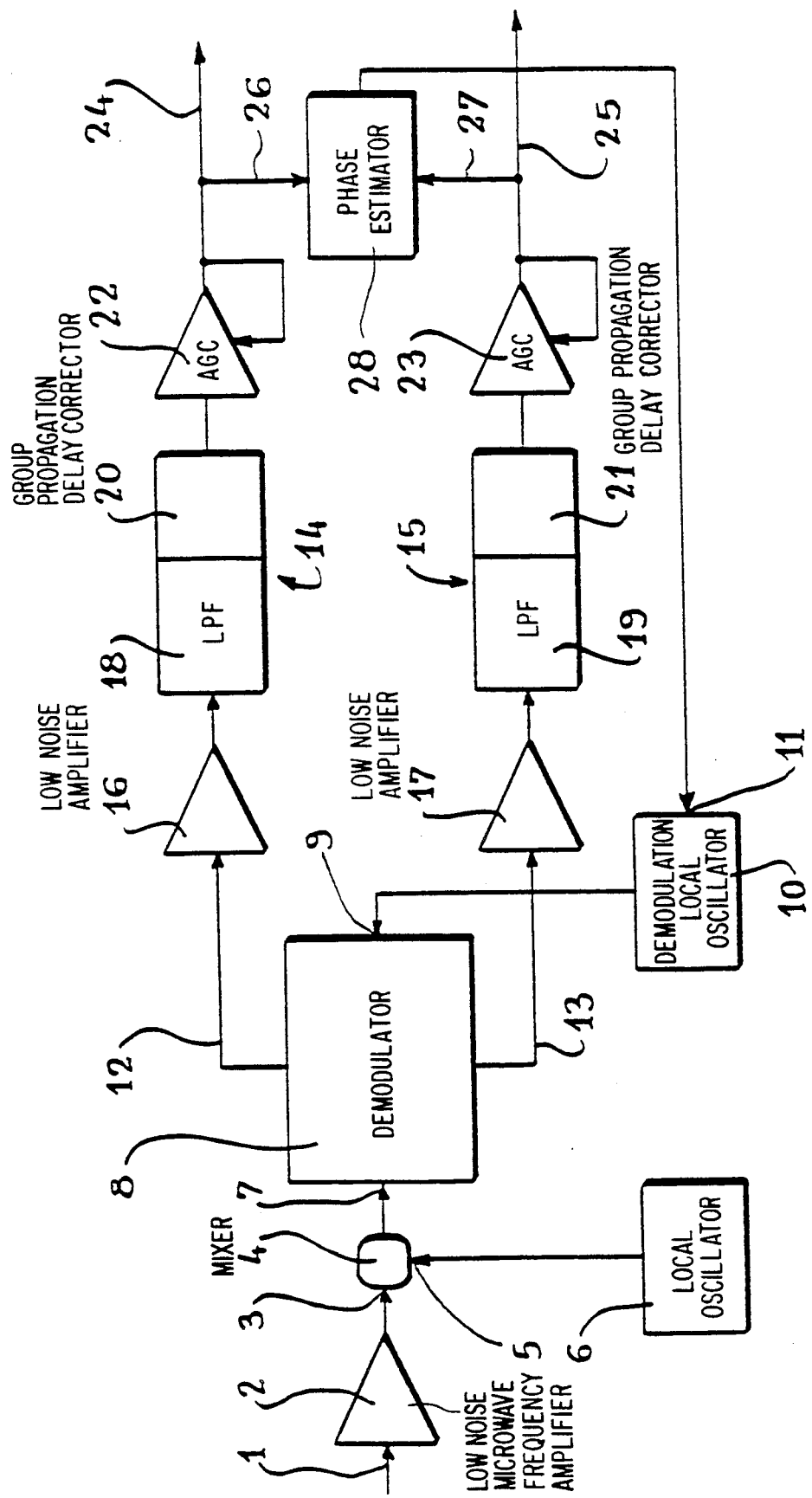

DIGITAL RADIO LINK RECEIVING DEVICE

BACKGROUND OF THE INVENTION

1. Field of the Invention

The present invention relates to digital radio link receiving device.

The term "digital radio link" is generally used to designate the channel used for transmitting digital information. This radio link is hence made up by a send device, a receive device, and the propagation space separating them.

2. Brief Description of Prior Art

A conventional digital receiver is normally composed of three parts:

a first microwave frequency part including a low noise amplifier adapted to reduce the noise factor of the whole system by the maximum amount possible, a mixer for downconverting the microwave signal to an intermediate frequency (typically 70 or 140 Megahertz), and microwave frequency conversion or transposition oscillator;

an intermediate part including a low noise amplifier, a channel filter, a group propagation delay corrector and a transposition oscillator, a digital demodulator and a demodulation oscillator; and a baseband part comprising in particular a device for carrier recovery at intermediate frequency.

This type of receiver has the advantage of possessing a wide passband which is only limited by the passband of the microwave frequency low noise amplifier. On the other hand, however, it suffers from the drawback of including a large number of functional parts which penalizes it both as regards its power consumption and cost, as well as the volume it occupies. Moreover, the filter employed at intermediate frequency must possess arithmetic symmetry both in transmission as well as in group propagation delay, and is consequently very difficult to make bearing in mind the fact that for such frequencies, only the construction of passband filters having geometrical symmetry is something that is readily accessible.

Additionally, in accordance with French patent application FR-A-2 543 379, filed Mar. 13, 1983 digital receivers exist which, as they employ direct demodulation at microwave frequency, do not use downconversion to an intermediate frequency. A receiver of this type consists of two parts:

a microwave frequency part including a low noise amplifier, a microwave frequency demodulator and a demodulation microwave frequency oscillator; and a baseband part which includes, in particular, a phase estimator as well as for each demodulated channel, a low noise amplifier, a filter, a group propagation delay corrector, and an Automatic Gain Control amplifier.

This type of receiver suffers from the disadvantage of having such a small passband that this receiver can only practically be used in one single transmission channel. This passband is actually limited by the passband of the microwave frequency demodulator, which is small as it is not know how to provide an accurate microwave frequency phase shifter that includes a wide passband. Additionally, this microwave frequency modulator has a complex design and is difficult to set up and adjust.

SUMMARY OF THE INVENTION

The invention aims at overcoming the abovementioned drawbacks and provides for this purpose a digital radio link receiving device that successively comprises:

a microwave frequency part including a device for conversion to an intermediate frequency;

an intermediate frequency part limited to a device for direct demodulation of the signal at intermediate frequency; and a baseband part performing signal processing and comprising in particular a phase estimator as well as, for each demodulated channel:

a low noise amplifier, a lowpass filter, a group propagation delay corrector, an automatic gain control amplifier, the outputs from the two channels being respectively applied to the, inputs of said phase estimator.

BRIEF DESCRIPTION OF THE DRAWING

FIGURE 1 is a block diagram showing the digital radio link receiving device according to an embodiment of the invention.

DETAILED DESCRIPTION OF A PREFERRED EMBODIMENT

The invention will be readily understood and other objects, advantages an features thereof will become apparent from the following description of an embodiment of the receiver provided by way of non-limiting illustration and with reference to the attached drawing showing, in a single figure, a simplified block diagram.

With reference to this single figure, the received microwave frequency carrier digital signal is applied at 1 to a low noise microwave frequency amplifier 2. Such an amplifier possesses a wide passband and its essential function is to mask the noise factor of the remainder of the circuit that follows it.

The output signal from amplifier 2 is applied to a first input 3 of a mixer 4, using for example image frequency rejection, for downconverting it to an intermediate frequency, the mixer receiving in conventional fashion a fixed frequency super-high frequency signal originating from a local oscillator 6 on its second input 5.

The elements 2, 4 and 6 constitute the microwave frequency part of the receiver. The output signal leaving the downconversion mixer 4 at 7 is an intermediate frequency signal (typically at 70 or 140 Megahertz for example).

This intermediate frequency signal does not, in accordance with the invention, receive any particular processing but is rather directly demodulated in a demodulator 8 operating at intermediate frequency, and hence at fixed frequency. This demodulator 8 has two inputs, the input 7 derived from the downconversion mixer 4 and a further input 9 from a demodulation local oscillator 10 which itself is driven at 11 by the output signal from the phase estimator 28 which will be described below.

The demodulator 8 and the demodulation oscillator 11 constitute the intermediate frequency part of the receiver.

The two outputs 12 and 13 of demodulator 8 carry the two baseband channels 14, 15 of the demodulated signals (in this example we consider the case of four state phase modulation).

Each of the channels 14, 15 includes a conventional baseband signal processing device which notably comprises:

a low noise amplifier: 16 and 17 respectively;

a lowpass filter: 18 and 19 respectively;

a group propagation delay corrector: 20 and 21 respectively;

an automatic gain control (AGC) amplifier: 22 and 23 respectively.

The outputs 24 and 25 from these two channels 14, 15 are respectively applied to the inputs 26 and 27 of the abovesaid phase estimator 28. These outputs 24 and 25 are the outputs of the receiver.

The AGC amplifiers 22 and 23 function in the baseband part, after demodulation and baseband filtering. The AGC system is not able to lock onto a possible interference signal as the signal that is applied to the input of each AGC amplifier is filtered.

This receiver hence includes transposition to an intermediate frequency which enables it to possess a wide passband, but the use of this intermediate frequency is only limited to demodulation of the signal, the signal being processed at baseband frequency which is highly advantageous from the cost and design point of view, as well as from the maintenance and power consumption aspects. Obviously, the invention is not limited to the embodiment that has just been described. Thus, by way of a variant, it could be the downconversion microwave frequency oscillator 6 which is controlled by phase estimator 28, while the demodulation oscillator 10 would be allowed to run free. The microwave frequency oscillator 6 could be tuned. This receiver is similarly suitable for complex modulations (with 16, 64, or even 256 phase states) while still retaining its wide passband properties: demodulation, which is carrie out at fixed frequency, can be adjusted once and for all in an optimum manner and filtering, which is done in the baseband, can be readily implemented by using lowpass filters for which the cut-off frequencies can easily be accurately set up.

What we claim is:

1. A digital radio link receiving device comprising:
    a converter for converting a microwave frequency carrier digital signal to an intermediate frequency, said converter including:
        a low noise microwave frequency amplifier, coupled to receive the digital signal, and having a wide passband;
        a local oscillator for providing a microwave frequency signal; and
        a mixer, coupled to receive an output of said low-noise microwave frequency amplifier signal and to receive the microwave frequency signal provided by said local oscillator, for downconverting the microwave frequency signal to an intermediate frequency;
    a demodulation circuit including;
        a demodulator, coupled to receive the downconverted intermediate frequency output of said mixer; and
        a demodulator oscillator, said demodulator coupled to receive an output of said demodulation oscillator, and providing a pair of outputs which carry a pair of baseband channels, respectively; and
    a baseband processing circuit including:
        a pair of low-noise amplifiers respectively coupled to receive the pair of outputs of said demodulator;
        a pair of low-pass filters respectively coupled to receive outputs of said pair of low-noise amplifiers;
        a pair of group propagation delay correctors coupled to receive outputs of said pair of low-pass filers;
        a pair of automatic gain control amplifiers respectively coupled to receive outputs of said correctors; and
        a phase estimator coupled to receive respective outputs of said pair of automatic gain control amplifiers, for providing an output signal which drives said demodulation oscillator, the respective outputs of said automatic gain control amplifiers each representing an output of the digital radio link receiving device.

2. The receiving device as claimed in claim 1, wherein said local oscillator of said converter is a tuned oscillator.

3. The receiving device as defined in claim 1, wherein said demodulator of said baseband processing circuit operates at a fixed intermediate frequency.

4. A digital radio link receiving device comprising:
    a converter for converting a microwave frequency carrier digital signal to an intermediate frequency, said converter including:
        a low noise microwave frequency amplifier, coupled to receive the digital signal, and having a wide passband;
        a local oscillator for providing a microwave frequency signal; and
        a mixer, coupled to receive an output of said low-noise microwave frequency amplifier signal and to receive the microwave frequency signal provided by said local oscillator, for downconverting the microwave frequency signal to an intermediate frequency;
    a demodulation circuit including;
        a demodulator, coupled to receive the downconverted intermediate frequency output of said mixer; and
        a demodulator oscillator, said demodulator coupled to receive an output of said demodulation oscillator, and providing a pair of outputs which carry a pair of baseband channels, respectively; and
    a baseband processing circuit including:
        a pair of low-noise amplifiers respectively coupled to receive the pair of outputs of said demodulator;
        a pair of low-pass filters respectively coupled to receive outputs of said pair of low-noise amplifiers;
        a pair of group propagation delay correctors coupled to receive outputs of said pair of low-pass filers;
        a pair of automatic gain control amplifiers respectively coupled to receive outputs of said correctors; and
        a phase estimator coupled to receive respective outputs of said pair of automatic gain control amplifiers, for providing an output signal which drives said demodulation oscillator, the respective outputs of said automatic gain control amplifiers each representing an output of the digital radio link receiving device.

5. The receiving device as claimed in claim 4, wherein said local oscillator of said converter is a tuned oscillator.

6. The receiving device as defined in claim 4, wherein said demodulator of said baseband processing circuit operates at a fixed intermediate frequency.

* * * * *